US011393802B2

(12) United States Patent
Kang et al.

(10) Patent No.: US 11,393,802 B2
(45) Date of Patent: Jul. 19, 2022

(54) STRETCHABLE DISPLAY DEVICE HAVING A PLURALITY OF CONNECTION LINES

(71) Applicant: LG Display Co., Ltd., Seoul (KR)

(72) Inventors: Mingyu Kang, Paju-si (KR);
KyungChan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 103 days.

(21) Appl. No.: 17/061,058

(22) Filed: Oct. 1, 2020

(65) Prior Publication Data

US 2021/0111167 A1 Apr. 15, 2021

(30) Foreign Application Priority Data

Oct. 11, 2019 (KR) .................. 10-2019-0126231

(51) Int. Cl.
| | |
|---|---|
| *H01L 25/16* | (2006.01) |
| *H01L 51/00* | (2006.01) |
| *H01L 51/52* | (2006.01) |
| *H01L 33/64* | (2010.01) |
| *H01L 27/32* | (2006.01) |
| *H01L 33/32* | (2010.01) |

(52) U.S. Cl.
CPC .......... *H01L 25/162* (2013.01); *H01L 25/167* (2013.01); *H01L 27/3276* (2013.01); *H01L 33/641* (2013.01); *H01L 33/642* (2013.01); *H01L 33/644* (2013.01); *H01L 51/0097* (2013.01); *H01L 51/529* (2013.01); *H01L 33/32* (2013.01)

(58) Field of Classification Search
None
See application file for complete search history.

(56) References Cited

U.S. PATENT DOCUMENTS

| | | | | |
|---|---|---|---|---|
| 2019/0341433 | A1* | 11/2019 | Im | ...................... H01L 51/529 |
| 2020/0027945 | A1* | 1/2020 | Kim | ................... H01L 27/3246 |
| 2020/0037442 | A1* | 1/2020 | Keum | ................. H01L 27/3276 |
| 2020/0201393 | A1* | 6/2020 | Ahn | ...................... G06F 1/1626 |
| 2020/0212117 | A1* | 7/2020 | Jeon | ........................ H01L 51/56 |

FOREIGN PATENT DOCUMENTS

| | | |
|---|---|---|
| KR | 10-2009-0111967 A | 10/2009 |
| KR | 10-2010-0062218 A | 6/2010 |
| KR | 10-2011-0131381 A | 12/2011 |
| KR | 10-2014-0063190 A | 5/2014 |
| KR | 10-2015-0080886 A | 7/2015 |

* cited by examiner

*Primary Examiner* — Daniel Whalen
(74) *Attorney, Agent, or Firm* — Seed IP Law Group LLP

(57) ABSTRACT

According to an aspect of the present disclosure, a stretchable display device includes a lower substrate. A plurality of first substrates is disposed on the lower substrate and includes a plurality of pixels, and a plurality of connection lines electrically connects the plurality of pixels. A plurality of heat transfer lines overlap the plurality of connection lines, and a heat radiator is exposed to the outside and overlaps the plurality of connection lines and the plurality of heat transfer lines. By doing this, a heat radiation efficiency of the stretchable display device may be improved.

22 Claims, 11 Drawing Sheets

STRETCHABLE DISPLAY DEVICE HAVING A PLURALITY OF CONNECTION LINES

CROSS-REFERENCE TO RELATED APPLICATION

This application claims the priority of Korean Patent Application No. 10-2019-0126231 filed on Oct. 11, 2019, in the Korean Intellectual Property Office, the disclosure of which is incorporated herein by reference.

BACKGROUND

Technical Field

The present disclosure relates to a stretchable display device, and more particularly, to a stretchable display device including a heat radiation structure.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

An object to be achieved by the present disclosure is to provide a stretchable display device which improves a heat radiation efficiency of the stretchable display device.

Another object to be achieved by the present disclosure is to provide a stretchable display device in which heat may be radiated from a top surface and a bottom surface.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a stretchable display device includes: a lower substrate; a plurality of first substrates which is disposed on the lower substrate and includes a plurality of pixels, a plurality of connection lines which electrically connects the plurality of pixels; a plurality of heat transfer lines which overlaps the plurality of connection lines; and a heat radiator which is exposed to the outside and overlaps the plurality of connection lines and the plurality of heat transfer lines. By doing this, a heat radiation efficiency of the stretchable display device may be improved.

According to another aspect of the present disclosure, a stretchable display device includes a first flexible substrate; a plurality of rigid substrates which is disposed on the first flexible substrate to be spaced apart from each other; a light emitting element and a transistor disposed on each of the plurality of rigid substrates; a heat transfer layer which transfers heat generated in the light emitting element and the transistor; a plurality of connection lines which is in contact with a side surface of the heat transfer layer; and a bottom heat radiator which passes through the first flexible substrate and radiates heat transferred to the plurality of connection lines. By doing this, a heat radiation efficiency of the stretchable display device may be improved.

Other detailed matters of the exemplary embodiments are included in the detailed description and the drawings.

According to the present disclosure, a heat transfer layer and a heat transfer line are included in the stretchable display device to radiate heat so that heat generated in the plurality of pixels may be effectively radiated.

According to the present disclosure, a top heat radiator and a bottom heat radiator of the stretchable display device are included to radiate the heat to an upper portion and a lower portion of the stretchable display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
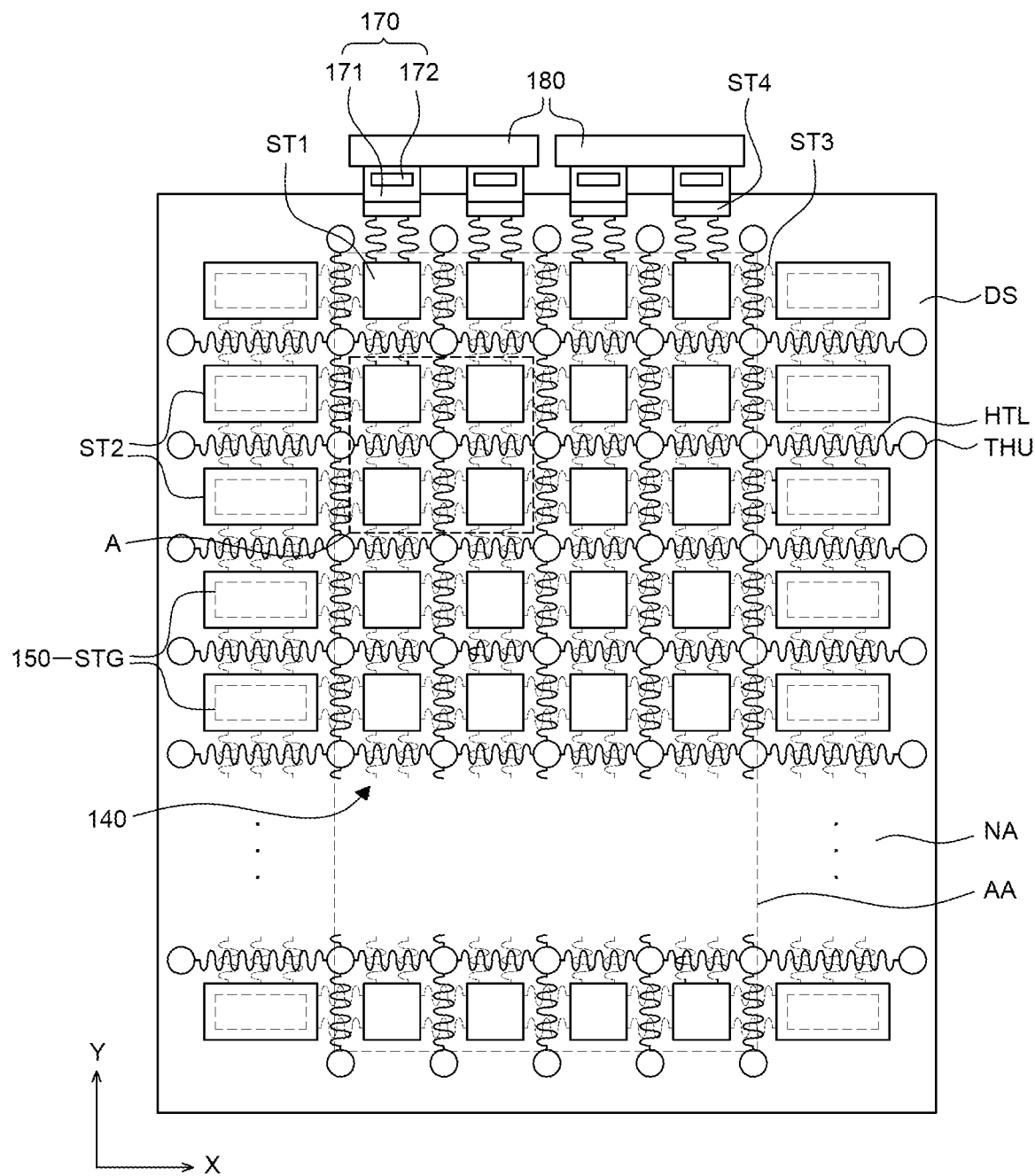
FIG. 1 is a schematic plan view of a stretchable display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly."

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to exemplary embodiments of the present disclosure will be described in detail with reference to accompanying drawings.

Stretchable Display Device

A stretchable display device may be referred to as a display device which is capable of displaying images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall surface. Further, when a force applied by the user is removed, the stretchable display device may return to its original shape.

FIG. 1 is a schematic plan view of a stretchable display device according to an exemplary embodiment of the present disclosure. Referring to FIG. 1, a stretchable display device 100 includes a lower substrate DS, a plurality of first substrates ST1, a plurality of second substrates ST2, a plurality of third substrates ST3, a plurality of fourth substrates ST4, a gate driver 150, a plurality of flexible films 170, and a printed circuit board 180.

The lower substrate DS is a substrate which supports and protects several components of the stretchable display device 100. The lower substrate DS, which is a flexible substrate, may be configured by an insulating material which may be bendable or extendable.

For example, the lower substrate DS may be formed of a silicon rubber such as polydimethylsiloxane (PDMS) or an elastomer such as polyurethane (PU) or polytetrafluoroethylene (PTFE) and thus have a flexible property. However, the material of the lower substrate DS is not limited thereto.

The lower substrate DS is a soft substrate so as to be reversibly expanded and contracted. Further, an elastic modulus of the lower substrate DS may be several MPa to several hundreds of MPa, for example, 0.7 MPa to 1 MPa. Further, a ductile breaking rate of the lower substrate DS may be 100% or higher. Here, the ductile breaking rate refers to an extension distance when an object to be stretched is broken or cracked. That is, the ductile breaking rate is defined as a percentage ratio of a length of an original object and a length of the stretched object when an object has been stretched sufficiently to be considered broken. For example, if a length of an object (e.g., lower substrate DS) is 100 cm when the object is not stretched, and then it reaches a length of 110 cm when the object has been stretched enough that it becomes broken or cracked at this length, then it was been stretched to 110% of its original length. In this case, the ductile breaking rate of the object is 110%. The number could, thus, also be called a ductile breaking ratio since it is a ratio of the stretched length as the numerator compared to the original upstretched length as the denominator at the time the break occurs.

The object is considered broken when it can no longer function properly in the structure or circuit. For example, a wire that is a conductor would be considered broken when there is a sufficient degradation in its ability to carry current such that it does not operate within the specifications of the circuit. Thus, in some embodiments, it might not require a full disconnection of the wire for it to be considered broken; a minor stress at a connection ends, a minor crack, a slight shift of the wire's location or other movement that causes it to no longer operate within its expected function would be considered a broken wire. If an insulator is stretched sufficiently so that it no longer provides the amount of insulation needed for the structure or circuit, it would be considered broken. Breaking would also include, in some embodiments, a non-elastic stretching in which the object has been sufficiently stretched such that it does not return to its original length and/or shape when it is no longer stretched.

The lower substrate DS may have a display area AA indicated in FIG. 1 by dashed lines AA and a non-display area NA enclosing the display area AA.

The display area AA is an area in which an image is displayed in the stretchable display device 100 and a light emitting element and various driving elements for driving the light emitting element are disposed in the display area AA. As illustrated in FIG. 2, the display area AA includes a plurality of pixels PX which includes a plurality of sub pixels SPX. The plurality of pixels PX is disposed in the display area AA and includes a plurality of light emitting elements. The plurality of sub pixels SPX may be connected to various wiring lines, respectively. For example, the plurality of sub pixels SPX may be connected to various wiring lines such as a gate line, a data line, a high potential power source line, a low potential power source line, and a reference voltage line.

The non-display area NA is an area adjacent to the display area AA. The non-display area NA is adjacent to the display area AA to enclose the display area AA. In the non-display area NA, no image is displayed and wiring lines and circuit units may be formed. For example, in the non-display area NA, a plurality of pads may be disposed, and the pads may be connected to the plurality of sub pixels SPX of the display areas AA, respectively.

The plurality of first substrates ST1 and the plurality of second substrates ST2 are disposed on the lower substrate DS. The plurality of first substrates ST1 is disposed in the display area AA and the plurality of second substrates ST2 may be disposed in the non-display area NA.

The plurality of first substrates ST1 and the plurality of second substrates ST2 are rigid substrates and are spaced apart from each other to be independently disposed on the lower substrate DS. The plurality of first substrates ST1 and the plurality of second substrates ST2 may be more rigid than the lower substrate DS. That is, the lower substrate DS may have flexible characteristics more than the plurality of first substrates ST1 and the plurality of second substrates ST2 and the plurality of first substrates ST1 and the plurality of second substrates ST2 may have rigid characteristic more than the lower substrate DS.

The plurality of first substrates ST1 and the plurality of second substrates ST2 which are rigid substrates may be formed of a plastic material having flexibility and for example, may be formed of polyimide (PI), polyacrylate, or polyacetate, but is not limited thereto. In this case, the plurality of first substrates ST1 and the plurality of second substrates ST2 may be formed of the same material, but are not limited thereto and may be formed of different materials.

Moduli of the plurality of first substrates ST1 and the plurality of second substrates ST2 may be higher than that of the lower substrate DS. The modulus is an elastic modulus indicating a rate of deformation by a stress and the higher the modulus, the higher the hardness. Therefore, the plurality of first substrates ST1 and the plurality of second substrates ST2 may be a plurality of rigid substrates having rigidity as compared with the lower substrate DS. For example, the moduli of the plurality of first substrates ST1 and the plurality of second substrates ST2 may be 1000 times higher than the modulus of the lower substrate DS, but are not limited thereto. For example, the moduli of the plurality of first substrates ST1 and the plurality of second substrates ST2 may be 1000 times higher than the modulus of the lower substrate DS, but are not limited thereto.

For example, elastic moduli of the plurality of first substrates ST1 and the plurality of second substrates ST2 may be 2 GPa to 9 GPa depending on a transparency. More specifically, when the plurality of first substrates ST1 and the plurality of second substrates ST2 are transparent, the elastic modulus is 2 GPa and when the plurality of first substrates ST1 and the plurality of second substrates ST2 are opaque, the elastic modulus is 9 GPa.

In the meantime, the plurality of first substrates ST1 and the plurality of second substrates ST2 having rigid characteristic are disposed on the lower substrate DS so that a partial area of the lower substrate DS which overlaps the plurality of first substrates ST1 and the plurality of second substrates ST2 may be defined as an area having rigidity. Further, in the remaining area of the lower substrate DS which does not overlap the plurality of first substrates ST1 and the plurality of second substrates ST2, only the lower substrate DS is disposed so that the remaining area may be defined as an area having flexibility. That is, areas where the plurality of first substrates ST1 and the plurality of second substrates ST2 are disposed are defined as a plurality of rigid areas and an area where the plurality of first substrates ST1 and the plurality of second substrates ST2 are not disposed may be defined as a soft area. In this case, the plurality of first substrates ST1 and the plurality of second substrates ST2 are disposed to be spaced apart from each other so that the plurality of rigid areas may be also disposed to be spaced apart from each other and the soft area may be disposed to be enclosed by the plurality of rigid areas.

A plurality of pixels PX including a plurality of sub pixels SPX may be disposed on the plurality of first substrates ST1. In each of the plurality of sub pixels SPX of the plurality of first substrates ST1, a light emitting element and a driving element may be disposed and various lines such as a gate line, a data line, and a power line may be disposed. The plurality of sub pixels SPX will be described in more detail below with reference to FIGS. 2A and 3.

The gate driver 150 may be mounted on the plurality of second substrates ST2. The gate driver 150 may be disposed in the non-display area NA. The gate driver 150 may be formed on the second substrate ST2 in a gate in panel (GIP) manner when various elements on the first substrate ST1 are manufactured. Therefore, various circuit configurations which configure the gate driver 150, such as various transistors, capacitors, and wiring lines may be disposed on the plurality of second substrates ST2. However, the gate driver 150 may be mounted in a chip on film (COF) manner, but is not limited thereto. Further, even though in FIG. 1, it is illustrated that the gate driver 150 is disposed on both sides of the non-display area NA, the gate driver may be disposed only on one side of the non-display area NA.

In the meantime, a size of the plurality of second substrates ST2 may be larger than a size of the plurality of first substrates ST1. As described above, on each of the plurality of second substrates ST2, the gate driver 150 is disposed. For example, one stage STG of the gate driver 150 may be disposed on each of the plurality of second substrates ST2. Therefore, an area occupied by various circuit configurations which configure one stage STG of the gate driver 150 may be relatively larger than an area of the first substrate ST1 on which the pixel PX is disposed. A size of each of the plurality of second substrates ST2 may be larger than a size of each of the plurality of first substrates ST1.

The plurality of third substrates ST3 is disposed between the plurality of first substrates ST1 and the plurality of second substrates ST2. The plurality of third substrates ST3 which connects the plurality of first substrates ST1 and the plurality of second substrates ST2 to each other is disposed between the plurality of first substrates ST1, between the plurality of second substrates ST2, and between the plurality of first substrates ST1 and the plurality of second substrates ST2. The plurality of third substrates ST3 is substrates which connect adjacent first substrates ST1, adjacent second substrates ST2, and the first substrate ST1 and the second substrate ST2 which are adjacent to each other. The plurality of third substrates ST3 may be integrally formed by being simultaneously formed with the same material as the plurality of first substrates ST1 and the plurality of second substrates ST2, but is not limited thereto.

The plurality of third substrates ST3 may be formed with a wavy shape on a flat surface. For example, the plurality of third substrates ST3 may have a sine wave shape. However, the shape of the plurality of third substrates ST3 is not limited thereto and the plurality of third substrates ST3 may extend with a zigzag pattern or may be formed with various shapes such as a shape extended by connecting a plurality of rhombus-shaped substrates at vertexes. Further, the number and the shape of the plurality of third substrates ST3 are illustrative and the number and the shape of the plurality of third substrates ST3 may vary depending on the design.

The plurality of flexible films 170 is a film in which various components are disposed on a base film 171 having a flexibility and supplies signals to the plurality of sub pixels SPX of the display area AA. The plurality of flexible films 170 may be bonded to the plurality of pads disposed in the non-display area NA.

Specifically, the plurality of flexible films 170 is not directly bonded on the lower substrate DS, but may be bonded on the plurality of fourth substrates ST4. The plurality of fourth substrates ST4 is disposed in one side of the non-display area NA so that a plurality of pads to which the plurality of flexible films 170 is bonded is formed. Further, in the plurality of fourth substrates ST4 to which the plurality of flexible films 170 is bonded, wiring lines which transmit signals from the plurality of flexible films 170 to the sub pixels of the plurality of first substrates ST1 and the gate driver 150 of the plurality of second substrates ST2 may be disposed. The plurality of fourth substrates ST4 may be integrally formed by being simultaneously formed with the same material as the plurality of first substrates ST1 and the plurality of second substrates ST2, but is not limited thereto.

The plurality of flexible films 170 supplies a power voltage, a data voltage, and a gate signal to the plurality of sub pixels SPX of the display area AA through the pads. The plurality of flexible films 170 includes a base film 171 and a driving IC 172. Further, various components may be additionally disposed on the flexible films 170. In the meantime, even though in FIG. 1, four flexible films 170 are illustrated, the number of the plurality of flexible films 170 is not limited thereto.

The base film 171 is a layer which supports the driving IC 172 of the plurality of flexible films 170. The base film 171 may be formed of an insulating material, and for example, may be formed of an insulating material having a flexibility.

The driving IC 172 is a component which processes data for displaying images and a driving signal for processing the images. In FIG. 1, even though it is illustrated that the driving IC 172 is mounted in a COF manner, the driving IC may be mounted by a technique such as chip on glass (COG) or tape carrier package (TCP), but it is not limited thereto.

A control unit such as an IC chip or a circuit unit may be mounted on the printed circuit board 180. Further, on the printed circuit board 180, a memory or a processor may be mounted. The printed circuit board 180 is a component which transmits a signal for driving the light emitting element to the light emitting element. Even though in FIG. 1, it is described that three printed circuit boards 180 are used, the number of printed circuit boards 180 is not limited thereto.

Further, the stretchable display device 100 according to the exemplary embodiment of the present disclosure may further comprise a heat transfer line HTL disposed between the first substrates ST1 and a heat radiator configured by a top heat radiator THU and a bottom heat radiator.

The heat transfer line HTL is a line which transfers heat generated in the plurality of pixels PX to the outside of the pixels PX. The heat transfer line HTL is disposed between the first substrates ST1 to transfer heat generated in the pixel PX to the soft area. For example, as illustrated in FIG. 1, the heat transfer line HTL may be disposed between the first substrates ST1 in a matrix.

Further, the heat radiator is a component which radiates heat transferred by the heat transfer line HTL to the outside or an external environment through convection, conduction, and other like heat transfer principles. Specifically, the top heat radiator THU is in contact with the heat transfer line HTL and is exposed to the outside. Therefore, the top heat radiator THU may release the heat transferred from the heat transfer line HTL to the outside. For example, in FIG. 1, it is illustrated that the top heat radiator THU is disposed in an intersection area of the plurality of heat transfer lines HTL. However, the present disclosure is not limited thereto so that the top heat radiator THU may be disposed in all areas overlapping the heat transfer line HTL.

The heat transfer line HTL and the heat radiator will be described in more detail with reference to FIG. 2A.

Hereinafter, the plurality of sub pixels SPX of the stretchable display device 100 according to an exemplary embodiment of the present disclosure will be described in more detail with reference to FIGS. 2A and 3.

Planar and Cross-Sectional Structures of Pixel

Figure 2A:
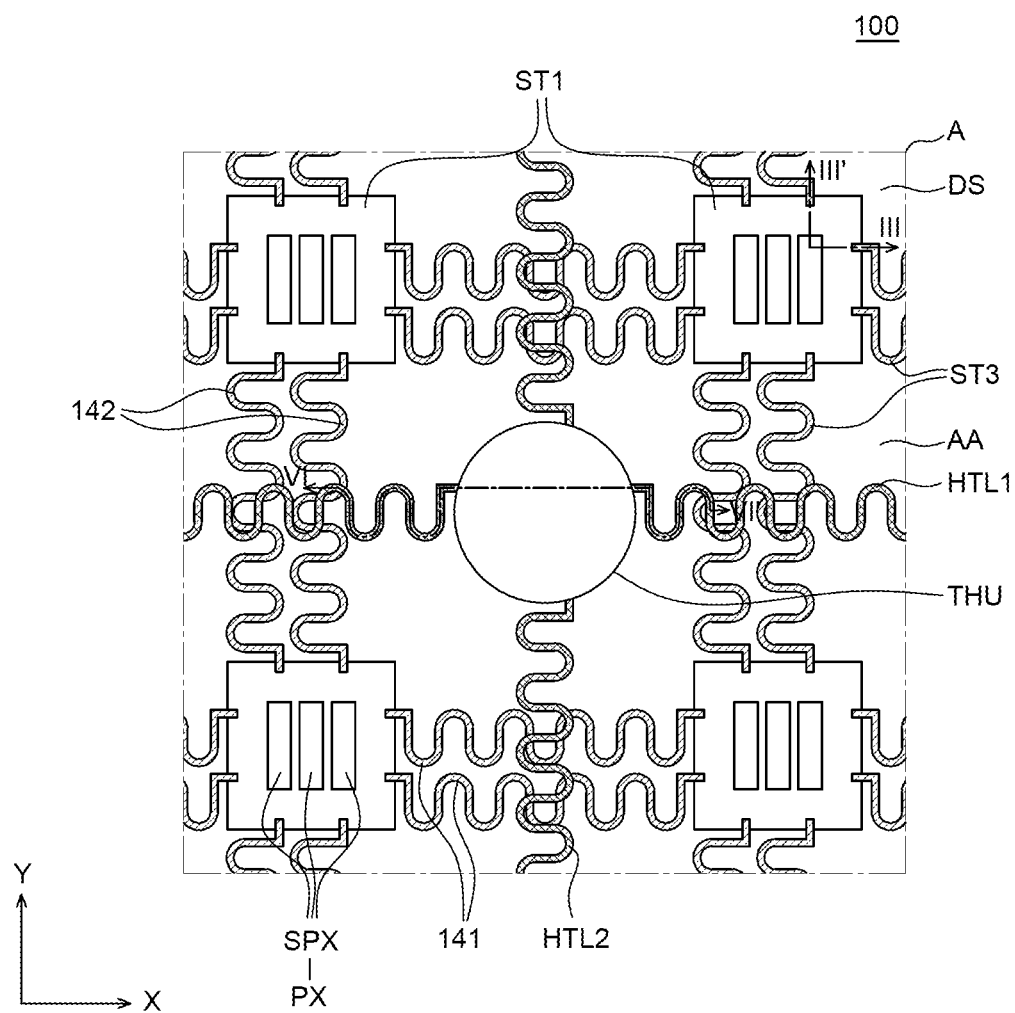
FIGS. 2A and 2B are schematic enlarged plan views of an A area of FIG. 1.
Figure 2B:
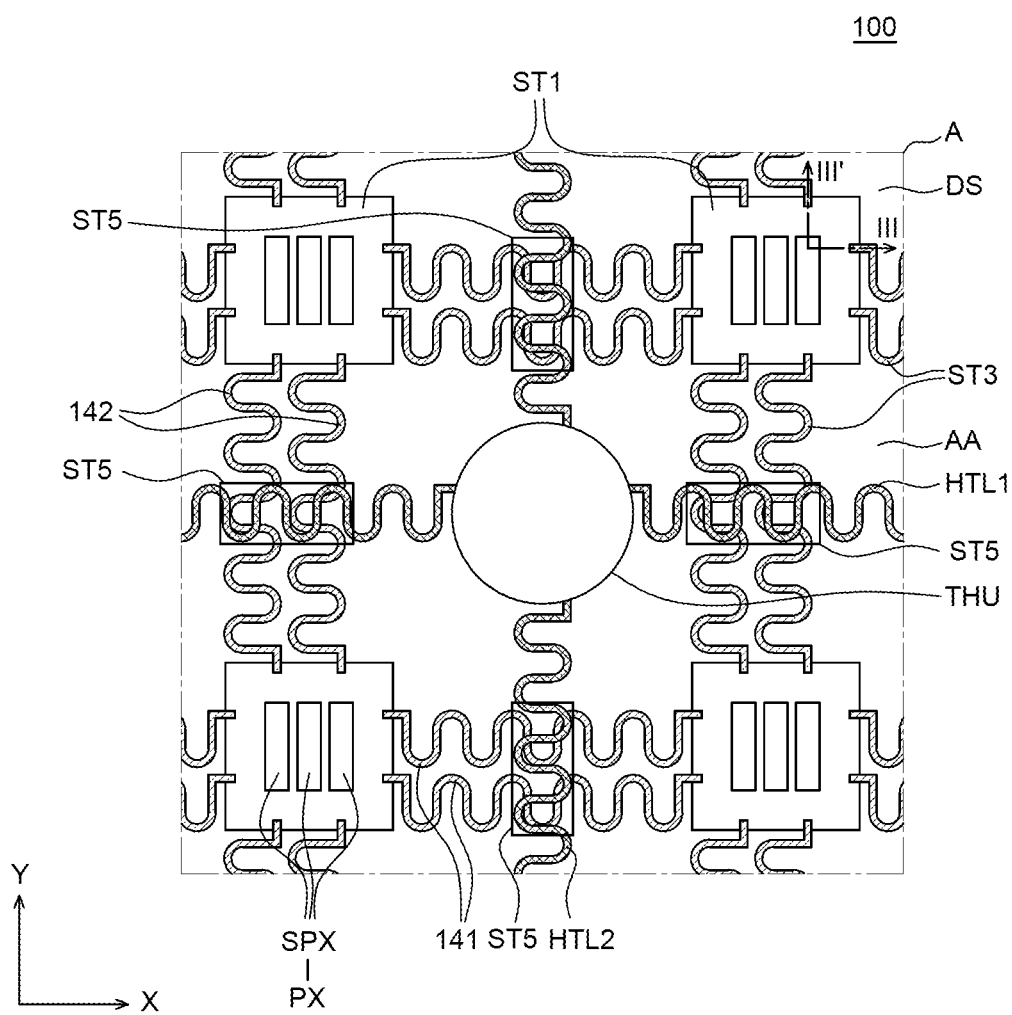

FIGS. 2A and 2B are schematic enlarged plan views of an A area of FIG. 1. FIG. 3 is a cross-sectional view taken along the line of FIG. 2A.

Figure 3:
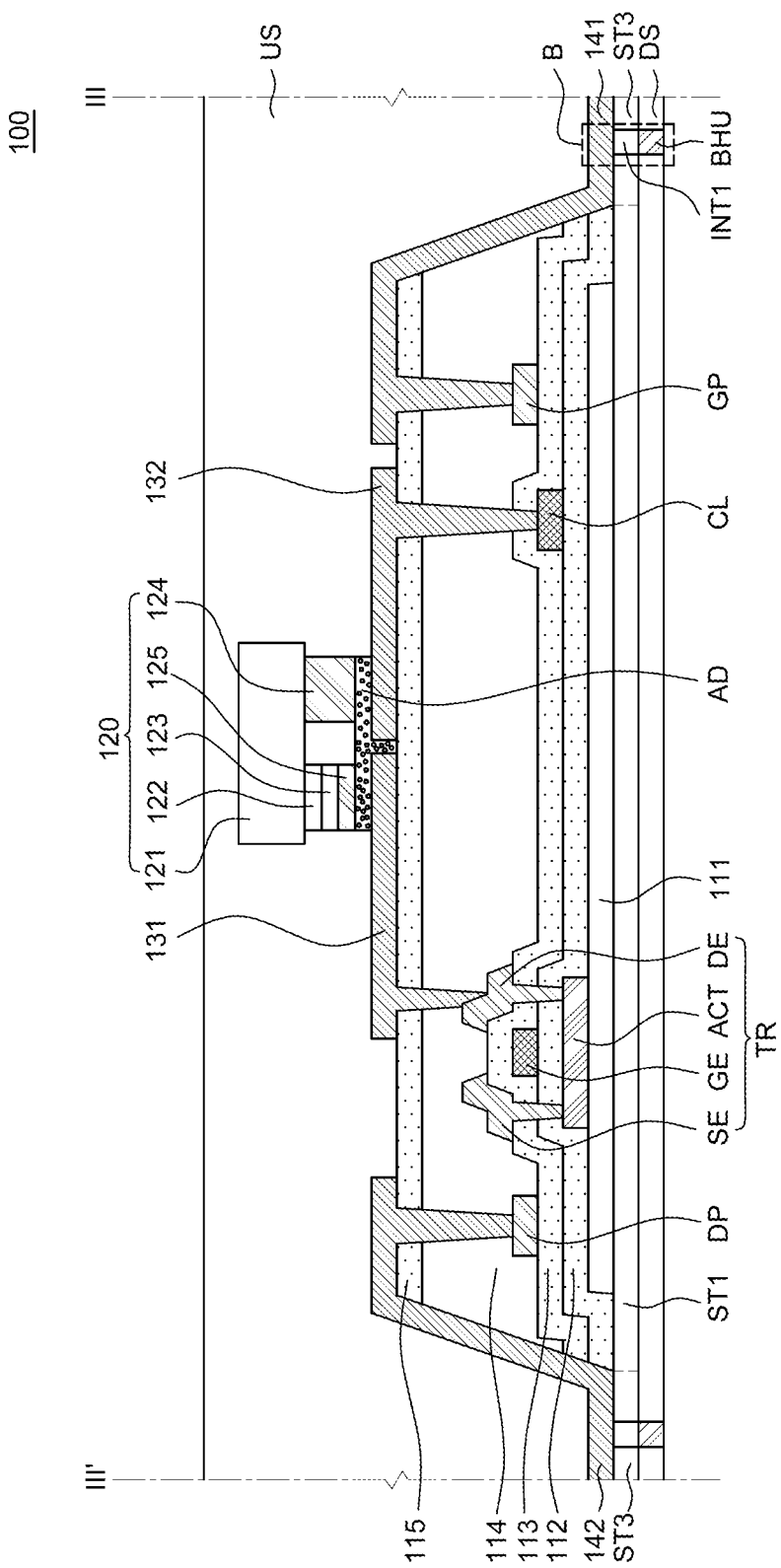
FIG. 3 is a cross-sectional view taken along the line of FIG. 2A.

Referring to FIGS. 2A and 3, the plurality of first substrates ST1 is disposed on the lower substrate DS in the display area AA. As illustrated in FIG. 1, the plurality of first substrates ST1 may be disposed on the lower substrate DS in a matrix, but is not limited thereto.

A buffer layer 111 is disposed on the plurality of first substrates ST1. The buffer layer 111 is a layer for protecting various components of the stretchable display device 100 from permeation of moisture and oxygen from the outside of the lower substrate DS and the plurality of first substrates ST1 and may be formed on the plurality of first substrates ST1. The buffer layer 111 may be configured by an insulating material and for example, configured by a single layer or a double layer of an inorganic layer formed of silicon nitride (SiNx), silicon oxide (SiOx), and silicon oxynitride (SiON). However, the buffer layer 111 may be omitted depending on a structure or a characteristic of the stretchable display device 100.

In this case, the buffer layer 111 may be formed only in an area overlapping the plurality of first substrates ST1 and the plurality of second substrates ST2. As described above, the buffer layer 111 may be formed of an inorganic material so that the buffer layer may be easily cracked or damaged during a process of drawing the stretchable display device 100. In this case, the buffer layer 111 is not formed in an area between the plurality of first substrates ST1 and the plurality of second substrates ST2, but is patterned to have a shape of the plurality of first substrates ST1 and the plurality of second substrates ST2 to be disposed only above the plurality of first substrates ST1 and the plurality of second substrates ST2. Therefore, in the stretchable display device 100 according to the exemplary embodiment of the present disclosure, the buffer layer 111 is formed only in an area overlapping the plurality of first substrates ST1 and the plurality of second substrates ST2 which are rigid substrates. Therefore, even though the stretchable display device 100 is bent or extended to be deformed, the damage of the buffer layer 111 may be suppressed.

A transistor TR including an active layer ACT, a gate electrode GE, a source electrode SE, and a drain electrode DE is disposed on the buffer layer 111.

The active layer ACT is disposed on the buffer layer 111. For example, the active layer ACT may be formed of an oxide semiconductor or amorphous silicon (a-Si), polycrystalline silicon (poly-Si), or an organic semiconductor.

A first heat transfer layer 112 is disposed on the active layer ACT. The first heat transfer layer 112 electrically insulates the gate electrode GE and the active layer ACT and releases heat generated in the gate electrode GE and the active layer ACT. Therefore, the first heat transfer layer 112 may be formed of a material having a low electrical conductivity and a high heat conductivity. For example, the first heat transfer layer 112 may be configured by a non-conductive heat-exchange polymer and for example, may be configured by a polymer material with a chain structure or polyethylene nanofibers. In some exemplary embodiments, the first heat transfer layer 112 may be configured by a triple layered structure of silicon nitride (SiNx) or silicon oxide (SiOx) which is an inorganic material—a silicon carbide (SiC) thin film or a diamond thin film—silicon nitride (SiNx) or silicon oxide (SiOx) which is an inorganic material, but is not limited thereto.

Further, in order to release the heat to the outside, an end of the first heat transfer layer 112 may be in contact with the connection line 140 (which may include a first connection line 141 and a second connection line 142, as will be described in further detail later herein). In FIG. 3, even though it is illustrated that both ends of the first heat transfer layer 112 are in contact with the connection line 140, the present disclosure is not limited thereto so that only one end of the first heat transfer layer 112 may be in contact with the connection line 140.

The gate electrode GE is disposed on the buffer layer 111. The gate electrode GE is disposed to overlap the active layer ACT. The gate electrode GE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

A second heat transfer layer 113 is disposed on the gate electrode GE. The second heat transfer layer 113 insulates the gate electrode GE from a source electrode SE and a drain electrode DE and releases heat generated in the gate electrode GE, the source electrode SE, and the drain electrode DE. Therefore, the second heat transfer layer 113 may also be formed of a material having a low electrical conductivity and a high heat conductivity. For example, the second heat transfer layer 113 may be configured by a non-conductive heat-exchange polymer and for example, may be configured by a polymer material with a chain structure or polyethylene nanofibers. In some exemplary embodiments, the second heat transfer layer 113 may be configured by a triple layered structure of silicon nitride (SiNx) or silicon oxide (SiOx) which is an inorganic material—a silicon carbide (SiC) thin film or diamond thin film—silicon nitride (SiNx) or silicon oxide (SiOx) which is an inorganic material, but is not limited thereto.

Further, in order to release the heat to the outside, an end of the second heat transfer layer 113 may be in contact with the connection line 140. In FIG. 3, even though it is illustrated that both ends of the second heat transfer layer 113 are in contact with the connection line 140, the present disclosure is not limited thereto so that only one end of the second heat transfer layer 113 may be in contact with the connection line 140.

The source electrode SE and the drain electrode DE which are in contact with the active layer ACT are disposed on the second heat transfer layer 113. The source electrode SE and the drain electrode DE are disposed on the same layer to be spaced apart from each other. The source electrode SE and the drain electrode DE may be in contact with the active layer ACT to be electrically connected to the active layer ACT. The source electrode SE and the drain electrode DE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Further, the first heat transfer layer 112 and the second heat transfer layer 113 are patterned to be formed only in an area overlapping the plurality of first substrates ST1. The first heat transfer layer 112 and the second heat transfer layer 113 may be formed to include inorganic materials so that the first heat transfer layer 112 and the second heat transfer layer 113 may be easily cracked to be damaged during the process of extending the stretchable display device 100. Therefore, the first heat transfer layer 112 and the second heat transfer layer 113 are not formed in an area between the plurality of first substrates ST1, but are patterned to have a shape of the plurality of first substrates ST1 to be formed only above the plurality of first substrates ST1.

Even though in FIG. 3, only a driving transistor among various transistors TR which may be included in the stretchable display device 100 is illustrated, a switching transistor or a capacitor may also be included in the stretchable display device 100. Further, in the specification, even though it is described that the transistor TR has a coplanar structure, various transistors such as a staggered transistor may also be used.

The plurality of pads may be disposed on the second heat transfer layer 113. For example, a gate pad GP among the plurality of pads may be disposed on the second heat transfer layer 113. The gate pad GP is a pad which transmits a gate signal to the plurality of sub pixels SPX. The gate signal may be transmitted to the gate electrode GE through a gate line formed on the first substrate ST1 from the gate pad GP. The gate pad GP may be formed of the same material as the source electrode SE and the drain electrode DE, but is not limited thereto.

For example, a data pad DP among the plurality of pads may be disposed on the second heat transfer layer 113. The data pad DP is a pad which transmits a data signal to the plurality of sub pixels SPX. The data signal may be transmitted to the source electrode SE or the drain electrode DE through a data line formed on the first substrate ST1 from the data pad DP. The data pad DP may be formed of the same material as the source electrode SE and the drain electrode DE, but is not limited thereto.

A planarization layer 114 is formed on the transistor TR and the heat transfer layer 113. The planarization layer 114 planarizes an upper portion of the transistor TR. The planarization layer 114 may be configured by a single layer or a plurality of layers and may be formed of an organic material. For example, the planarization layer 114 may be formed of an acrylic-based organic material, but is not limited thereto.

Referring to FIG. 3, the planarization layer 114 may be disposed on the plurality of first substrates ST1 to planarize a curved top surface of the second heat transfer layer 113. By doing this, the step of the second heat transfer layer 113 may be supplemented. Further, the planarization layer 114 may enhance an adhesive strength of the connection line 140 disposed on a side surface of the planarization layer 114.

In some exemplary embodiments, a passivation layer may be formed between the transistor TR and the planarization layer 114. That is, the passivation layer may be formed to cover the transistor TR to protect the transistor TR from the infiltration of the moisture and oxygen. The passivation layer may be formed of an inorganic material and configured by a single layer or a plurality of layers, but is not limited thereto.

Further, a third heat transfer layer 115 may be disposed on the planarization layer 114. That is, the third heat transfer layer 115 may be disposed between the LED 120 which is a light emitting element and a transistor TR which is a driving element. Further, the third heat transfer layer releases heat generated in the LED 120 which is a light emitting element.

Therefore, the third heat transfer layer 115 may be formed of a material having a low electrical conductivity and a high heat conductivity. For example, the third heat transfer layer 115 may be configured by a non-conductive heat-exchange polymer and for example, may be configured by a polymer material with a chain structure or polyethylene nanofibers. In some exemplary embodiments, the third heat transfer layer 115 may be configured by a triple layered structure of silicon nitride (SiNx) or silicon oxide (SiOx) which is an inorganic material—silicon carbide (SiC) thin film or a diamond thin film—silicon nitride (SiNx) or silicon oxide (SiOx) which is an inorganic material, but is not limited thereto.

Further, in order to release the heat generated in the LED 120 to the outside, an end and a top surface of the third heat transfer layer 115 may be in contact with the connection line 140. In FIG. 3, even though it is illustrated that both ends of the third heat transfer layer 115 are in contact with the connection line 140, the present disclosure is not limited thereto so that only one end of the third heat transfer layer 115 may be in contact with the connection line 140.

In the meantime, a common line CL is disposed on the first heat transfer layer 112. The common line CL is a wiring line which applies a common voltage to the plurality of sub pixels SPX. The common line CL may be formed of the same material as the gate electrode GE of the transistor TR, but is not limited thereto.

A plurality of connection lines 140 is disposed on the plurality of third substrates ST3. The plurality of connection lines 140 is wiring lines which electrically connect the pads on the plurality of first substrates ST1 and the plurality of second substrates ST2.

Further, the plurality of connection lines 140 is in contact with the first heat transfer layer 112, the second heat transfer layer 113, and the third heat transfer layer 115 to release heat generated in the pixel PX to the outside.

The plurality of connection lines 140 includes the first connection line 141 and the second connection line 142. The first connection line 141 and the second connection line 142 are disposed between the plurality of first substrates ST1. Specifically, the first connection line 141 refers to a wiring line extending in an X-axis direction between the plurality of first substrates ST1 and the plurality of second substrates ST2, among the plurality of connection lines 140. The second connection line 142 refers to a wiring line extending in a Y-axis direction between the plurality of first substrates ST1 and the plurality of second substrates ST2, among the plurality of connection lines 140.

In the meantime, even though in FIG. 2, it is described that two connection lines 140 are disposed between the plurality of first substrates ST1 and the plurality of second substrates ST2, the number of connection lines 140 is not limited thereto.

The plurality of connection lines 140 may be configured by a material having a high electrical conductivity and a high heat conductivity.

For example, the connection lines 140 may be formed of a metal material such as copper (Cu), aluminum (Al), titanium (Ti), and molybdenum or a stacked structure of metal materials such as copper/molybdenum-titanium (Cu/MoTi) or titanium/aluminum/titanium (Ti/Al/Ti), but is not limited thereto.

The connection lines 140 formed of a metal material as described above may have a wavy shape on a flat surface. For example, the plurality of connection lines 140 may have a sine wave shape. However, the shape of the plurality of connection lines 140 is not limited thereto and the plurality of connection lines 140 may extend with a zigzag pattern or may be formed with various shapes such as a shape extended by connecting a plurality of rhombus-shaped substrates at vertexes. Further, the number and the shape of the plurality of connection lines 140 are illustrative and the number and the shape of the plurality of connection lines 140 may vary depending on the design.

Further, the connection lines 140 may be formed of a stacked structure of metal materials or may be formed of a base polymer in which conductive particles are dispersed to be disposed between the first substrates ST1 and the plurality of second substrates ST2 with a linear shape. The base polymer may be configured by an insulating material which is bendable or extendable, similarly to the lower substrate DS. For example, the base polymer may include silicon rubber such as polydimethylsiloxane (PDMS), elastomer such as polyurethane (PU), or styrene butadiene styrene (SBS), but is not limited thereto. Therefore, even though the stretchable display device 100 is bent or extended, the base polymer may not be damaged.

The conductive particles may be dispersed in the base polymer. The conductive particles are dispersed in the base polymer to form a conductive path which electrically connects pads disposed in the first substrate ST1 and the second substrate ST2 which are adjacent to each other. The conductive particles may include at least one of silver (Ag), gold (Au), and carbon, but are not limited thereto.

In the meantime, in the case of a general display device, various wiring lines such as a plurality of gate lines and a plurality of data lines extend between the plurality of sub pixels with a linear shape and the plurality of sub pixels is connected to one signal line. Therefore, in the general display device, various wiring lines such as a gate line, a data line, a high potential power source line, and a reference voltage line extend from one side to the other side of the display device without being disconnected on the substrate.

In contrast, in the case of the stretchable display device 100 according to the exemplary embodiment of the present disclosure, various wiring lines formed of a metal material, such as the gate line, the data line, the power line, and the common line, are disposed only on the plurality of first substrates ST1 and the plurality of second substrates ST2. That is, in the stretchable display device 100 according to the exemplary embodiment of the present disclosure, various wiring lines which are formed of a metal material and extend with a linear shape may be disposed only on the plurality of first substrates ST1 and the plurality of second substrates ST2. Therefore, various wiring lines are patterned so as to correspond to the plurality of first substrates ST1 and the plurality of second substrates ST2 to be discontinuously disposed.

In the stretchable display device 100 according to the exemplary embodiment of the present disclosure, in order to connect discontinuous wiring lines on the plurality of first substrates ST1 and the plurality of second substrates ST2, the plurality of connection lines 140 is disposed between the plurality of adjacent first substrates ST1, between the plurality of adjacent second substrates ST2, and between the plurality of first substrates ST1 and the plurality of second substrates ST2 which are adjacent to each other. The plurality of connection lines 140 electrically may connect the pads which are adjacent to each other on the plurality of first substrates ST1 and the plurality of second substrates ST2. For example, the pads on the adjacent first substrates ST1, the adjacent second substrates ST2, or the first substrate ST1 and the second substrate ST2 which are adjacent to each other may be electrically connected by the plurality of connection lines 140. Accordingly, the stretchable display device 100 according to the exemplary embodiment of the present disclosure may include the plurality of connection lines 140 to electrically connect various wiring lines on the plurality of first substrates ST1 and the plurality of second substrates ST2 which are spaced apart from each other between the plurality of first substrates ST1, between the plurality of second substrates ST2, and between the plurality of first substrates ST1 and the plurality of second substrates ST2.

The first connection line 141 may connect pads on two first substrates ST1 which are disposed side by side among the pads on the plurality of first substrates ST1 which is disposed to be adjacent to each other in the X-axis direction. The first connection line 141 may serve as a gate line, an emission signal line, a high potential power source line, or a low potential power source line, but is not limited thereto. For example, the first connection line 141 may serve as a gate line and electrically connect the gate pads GP on two first substrates ST1 which are disposed side by side in the X-axis direction. Therefore, as described above, the gate pads GP on the plurality of first substrates ST1 disposed in the X-axis direction may be connected by the first connection line 141 serving as a gate line and transmit one gate signal.

Referring to FIG. 2, the second connection line 142 may connect pads on two first substrates ST1 which are disposed side by side among the pads on the plurality of first substrates ST1 which is disposed to be adjacent to each other in the Y-axis direction. The second connection line 142 may serve as a data line, a high potential power source line, a low potential power source line, or a reference voltage line, but is not limited thereto. For example, the second connection line 142 may serve as a data line and electrically connect the data lines on two first substrates ST1 which are disposed side by side in the Y-axis direction. Therefore, as described above, the data pads DP on the plurality of first substrates ST1 disposed in the Y-axis direction may be connected by the plurality of second connection lines 142 serving as data lines and transmit one data signal.

Referring to FIG. 3, a first connection pad 131 and a second connection pad 132 are disposed on the third heat transfer layer 115. The first connection pad 131 is an electrode which electrically connects the LED 120 to be described below and the transistor TR. For example, the first connection pad 131 may electrically connect the drain electrode DE of the transistor TR and the LED 120 through a contact hole formed in the planarization layer 114 and the third heat transfer layer 115.

The second connection pad 132 is an electrode which electrically connects the LED 120 and the common line CL. For example, the second connection pad 132 may electrically connect the common electrode and the LED 120 through the contact hole formed in the planarization layer 114.

The LED 120 which is an inorganic light emitting element is disposed on the first connection pad 131 and the second connection pad 132, as a light emitting element. The LED 120 may be transferred onto the first substrate ST1 through a transferring process. The LED 120 includes an n-type layer 121, an active layer 122, a p-type layer 123, an n-electrode 125, and a p-electrode 124. Hereinafter, it is assumed that the LED 120 of the stretchable display device 100 according to the exemplary embodiment of the present disclosure has a flip-chip structure in which the n-electrode 125 and the p-electrode 124 are formed on one surface. However, the LED 120 may be formed with a vertical structure or a horizontal structure, and is not limited thereto.

The n-type layer 121 may be formed by injecting an n-type impurity into gallium nitride (GaN). The n-type layer 121 may be disposed on a separate base substrate which is formed of a material which is capable of emitting light.

The active layer 122 is disposed on the n-type layer 121. The active layer 122 is a light emitting layer which emits light in the LED 120 and may be formed of a nitride semiconductor, for example, indium gallium nitride (InGaN). The p-type layer 123 is disposed on the active layer 122. The p-type layer 123 may be formed by injecting a p-type impurity into gallium nitride (GaN).

As described above, the LED 120 according to the exemplary embodiment of the present disclosure may be manufactured by sequentially laminating the n-type layer 121, the active layer 122, and the p-type layer 123, and then etching a predetermined part to form the n-electrode 125 and the p-electrode 124. In this case, the predetermined part which is a space for separating the n-electrode 125 and the p-electrode 124 from each other may be etched to expose a part of the n-type layer 121. In other words, the surfaces of the LED 120 on which the n-electrode 125 and the p-electrode 124 are disposed are not flat surfaces, but have different height levels.

As described above, in the etched area, in other words, on the n-type layer 121 exposed by the etching process, the n-electrode 125 is disposed. The n-electrode 125 may be formed of a conductive material. In the meantime, in an area which is not etched, in other words, on the p-type layer 123, the p-electrode 124 is disposed. The p-electrode 124 may be also formed of a conductive material, and for example, may be formed of the same material as the n-electrode 125.

The adhesive layer AD is disposed between the first connection pad 131 and the p-electrode 124 and between the second connection pad 132 and the n-electrode 125 to attach the LED 120 onto the first connection pad 131 and the second connection pad 132.

The adhesive layer AD may be a conductive adhesive layer AD in which conductive balls are dispersed in an insulating base member. When heat or pressure is applied to the adhesive layer AD, the conductive balls are electrically connected in a portion applied with heat or pressure to have a conductive property and an area which is not pressurized may have an insulating property. For example, the n-electrode 125 is electrically connected to the second connection line 142 by means of the adhesive layer AD and the p-electrode 124 may be electrically connected to the first connection line 141 by means of the adhesive layer AD. That is, after applying the adhesive layer AD on the first connection pad 131 and the second connection pad 132 using an inkjet method, the LED 120 is transferred onto the adhesive layer AD and the LED 120 is pressurized and heated. By doing this, the first connection pad 131 may be electrically connected to the p-electrode 124 and the second connection pad 132 may be electrically connected to the n-electrode 125. However, the remaining part of the adhesive layer AD excluding a part of the adhesive layer AD disposed between the n-electrode 125 and the second connection pad 132 and a part of the adhesive layer AD disposed between the p-electrode 124 and the first connection pad 131 has an insulating property. In the meantime, the adhesive layer AD may be divided to be disposed on the first connection pad 131 and the second connection pad 132, respectively.

As described above, the stretchable display device 100 according to the exemplary embodiment of the present disclosure has a structure in which the LED 120 is disposed on the first substrate ST1 on which the transistor TR is disposed. Therefore, when the stretchable display device 100 is turned on, different voltage levels which are applied to the first connection pad 131 and the second connection pad 132 are transmitted to the n-electrode 125 and the p-electrode 124 so that the LED 120 may emit light.

In the meantime, even though not illustrated in the drawing, a bank may be further formed on the planarization layer 114. The bank may be disposed between adjacent sub pixels SPX to minimize the color mixture phenomenon caused by light which is emitted from the LED 120 of one sub pixel SPX and transmitted to an adjacent sub pixel SPX. For example, the bank is disposed so as to cover at least a part of the first connection pad 131 and the second connection pad 132 and may be spaced apart from the LED 120. The bank may be formed of an insulating material such as acrylic-based resin, benzocyclobutene (BCB)-based resin or polyimide, but is not limited thereto. Further, the bank may further comprise a black material, for example, further comprise carbon black, but is not limited thereto.

The upper substrate US is disposed so as to cover the plurality of first substrates ST1 and the third substrate ST3 on the lower substrate DS. The upper substrate US is a substrate which supports various components disposed below the upper substrate US. Specifically, the upper substrate US may be formed by coating and curing a material which configures the upper substrate US on the lower substrate DS and the plurality of first substrates ST1.

The upper substrate US, which is a flexible substrate, may be configured by an insulating material which is bendable or extendable. The upper substrate US is a flexible substrate so as to be reversibly expanded and contracted. Further, an elastic modulus of the upper substrate US may be several MPa to several hundreds of MPa, for example, may be 0.5 MPa to 1 MPa. Further, a ductile breaking rate of the upper substrate US may be 100% or higher. A thickness of the upper substrate US may be 10 μm to 1 mm, but is not limited thereto.

The upper substrate US may be formed of the same material as the lower substrate DS. The upper substrate US may be formed of a material having a flexibility, for example, be formed of a silicon rubber such as polydimethylsiloxane (PDMS) or an elastomer such as polyurethane (PU) or polytetrafluoroethylene (PTFE), but is not limited thereto.

In the meantime, even though not illustrated in the drawing, a polarization layer may be further disposed on the upper substrate US. The polarization layer may perform a function which polarizes light incident from the outside of the stretchable display device 100 to reduce the external light reflection. Further, an optical film other than the polarization layer may be disposed on the upper substrate US.

The stretchable display device 100 needs to have a property which is easily bendable and stretchable, so that there is an attempt to use a substrate which has a small modulus to have a flexible property. However, when a flexible material such as polydimethylsiloxane (PDMS) having a small modulus is used as a lower substrate to be disposed while manufacturing a light emitting element, there is a problem in that the substrate is damaged due to a high temperature generated during the process of forming a transistor TR and a light emitting element, for example, a temperature of 100° C. or higher due to a characteristic of the material having a small modulus which is vulnerable to the heat.

Therefore, it is possible to suppress the damage of the substrate during the process of forming a light emitting element by forming the light emitting element above a substrate formed of a material which may be tolerable to the high temperature. Therefore, there is an attempt to form the substrate using a material which may be tolerable to the high temperature generated during the manufacturing process, such as polyimide (PI). However, since the materials which may be tolerable to the high temperature have a large modulus, there is a problem in that the materials do not have a flexible property so that the substrate is hardly bent or stretched during the process of drawing the stretchable display device 100.

Accordingly, in the stretchable display device 100 according to the exemplary embodiment of the present disclosure, the plurality of first substrates ST1 and the plurality of second substrates ST2 which are rigid substrates are disposed only in an area where the transistor TR is disposed. By doing this, the plurality of first substrates ST1 and the plurality of second substrates ST2 may not be damaged by the high temperature during the manufacturing process of the transistor TR.

Further, in the stretchable display device 100 according to the exemplary embodiment of the present disclosure, the lower substrate DS and the upper substrate US which are flexible substrates may be disposed below and above the plurality of first substrates ST1 and the plurality of second substrates ST2. Therefore, the remaining area of the lower substrate DS and the upper substrate US excluding the area overlapping the plurality of first substrates ST1 and the plurality of second substrates ST2 may be easily extended or bent, so that the stretchable display device 100 may be implemented. Further, the transistor TR, the LED 120, and the gate driver 150 disposed above the plurality of first substrates ST1 and the plurality of second substrates ST2 which are rigid substrates may be suppressed from being damaged as the stretchable display device 100 is bent or extended.

In the meantime, as described above, in the stretchable display device 100 according to the exemplary embodiment of the present disclosure, the first heat transfer layer 112 and the second heat transfer layer 113 may be disposed between the transistors TR. Therefore, the first heat transfer layer 112 and the second heat transfer layer 113 may effectively release heat generated in the transistor TR to the outside. Specifically, at least one side end of each of the first heat transfer layer 112 and the second heat transfer layer 113 is in contact with the connection line 140 so that the first heat transfer layer 112 and the second heat transfer layer 113 may transfer the heat generated in the transistor TR to the connection line 140.

Further, in the stretchable display device 100 according to the exemplary embodiment of the present disclosure, the third heat transfer layer 115 may be disposed between the LED 120 which is a light emitting element and a transistor TR which is a driving element. Therefore, the third heat transfer layer 115 may effectively release heat generated in the LED 120, which is a light emitting element, and the transistor TR, which is a driving element, to the outside. Specifically, the third heat transfer layer 115 may be in direct contact with lower portions of the first connection pad 131 and the second connection pad 132 which are disposed below the LED 120 which is a light emitting element.

Therefore, the third heat transfer layer 115 may transfer heat generated in the LED 120 which is a light emitting element to the connection line 140 through the first connection pad 131 and the second connection pad 132.

Further, since the connection line 140 may be formed of a material having a high heat conductivity, the heat transferred from the first heat transfer layer 112, the second heat transfer layer 113, and the third heat transfer layer 115 is transferred to a bottom heat radiator BHU through the connection line 140.

Further, the bottom heat radiator BHU releases the heat transferred from the connection line 140 to the outside.

In the meantime, a plurality of heat transfer lines HTL may be disposed in a soft area between the first substrates ST1 in a matrix. Further, the plurality of heat transfer line HTL may partially overlap the plurality of connection lines 140.

The plurality of heat transfer lines HTL includes a first heat transfer line HTL1 and a second heat transfer line HTL2. The first heat transfer line HTL1 and the second heat transfer line HTL2 are disposed between the plurality of first substrates ST1. Specifically, the first heat transfer line HTL1 refers to a wiring line extending in an X-axis direction between the plurality of first substrates ST1 and the plurality of first connection lines 141. The second heat transfer line HTL2 refer to a wiring line extending in a Y-axis direction between the plurality of first substrates ST1 and the plurality of second connection lines 142.

In the meantime, even though in FIG. 2A, it is described that one heat transfer line HTL is disposed between the plurality of first substrates ST1, the number of the plurality of heat transfer lines HTL is not limited thereto.

The plurality of heat transfer lines HTL may also be configured by a material having a high electrical conductivity and a high heat conductivity.

For example, the heat transfer lines HTL may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

The heat transfer lines HTL formed of a metal material as described above may have a wavy shape on a flat surface. For example, the plurality heat transfer lines HTL may have a sine wave shape. However, the shape of the plurality of heat transfer lines HTL is not limited thereto and the plurality of heat transfer lines HTL may extend with a zigzag pattern or may be formed with various shapes such as a shape extended by connecting a plurality of rhombus-shaped substrates at vertexes. Further, the number and the shape of the plurality of heat transfer lines HTL are illustrative and the number and the shape of the plurality of heat transfer lines HTL may vary depending on the design.

Further, the heat transfer lines HTL may be formed of a stacked structure of metal materials or may be formed of a base polymer in which conductive particles are dispersed to be disposed between the plurality of first substrates ST1 with a linear shape. The base polymer may be configured by an insulating material which may be bendable or extendable, similarly to the lower substrate DS. For example, the base polymer may include silicon rubber such as polydimethylsiloxane (PDMS), elastomer such as polyurethane (PU), or styrene butadiene styrene (SBS), but is not limited thereto. Therefore, when the stretchable display device 100 is bent or stretched, the base polymer may not be damaged.

The conductive particles may be dispersed in the base polymer. The conductive particles allow the heat transfer line HTL to transfer heat. The conductive particles may include at least one of silver (Ag), gold (Au), and carbon, but are not limited thereto.

Further, a top heat radiator THU releases the heat transferred from the heat transfer line HTL to the outside.

In the meantime, in some exemplary embodiments, as illustrated in FIG. 2B, a fifth substrate ST5 which is a rigid substrate may be further disposed in an area where the plurality of heat transfer lines HTL and the plurality of connection lines 140 overlap.

Therefore, the plurality of heat transfer lines HTL and the plurality of connection lines 140 disposed on the fifth substrate ST5 which is a rigid substrate does not extend in one direction. Therefore, a crack which may be caused in an area where the plurality of heat transfer lines HTL and the plurality of connection lines 140 overlap may be suppressed.

Bottom Heat Radiator

Figure 4A:
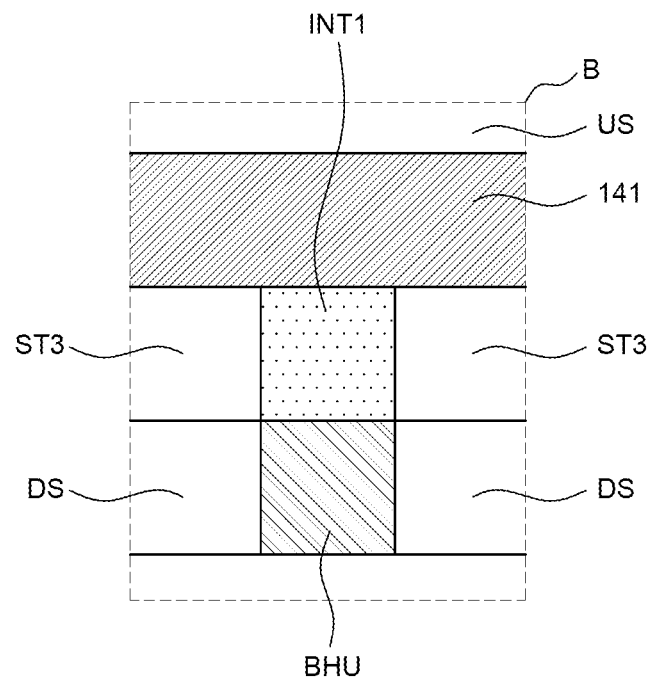
FIGS. 4A and 4B are schematic enlarged plan views of a B area of FIG. 3.
Figure 4B:
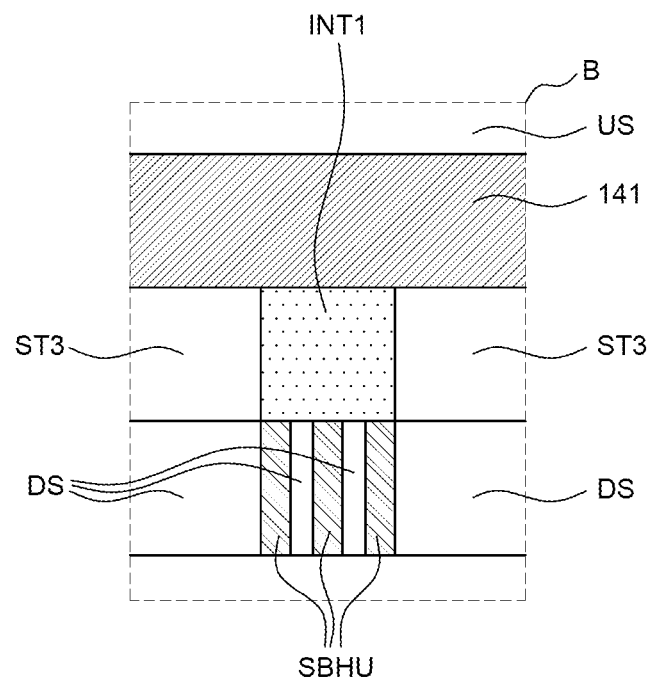

FIGS. 4A and 4B are schematic enlarged plan views of a B area of FIG. 3.

Referring to FIGS. 3 and 4A, an intermediate insulating layer INT1 and a bottom heat radiator BHU may be disposed below the connection line 140. Specifically, a heat radiation hole is formed in the third substrate ST3 and the lower substrate DS which are disposed below the connection line 140 and the intermediate insulating layer INT1 and the bottom heat radiator BHU may be disposed in the heat radiation hole.

The bottom heat radiator BHU releases the heat transferred from the connection line 140 to the outside. In order to release heat to the outside, one surface of the bottom heat radiator BHU may be exposed to the outside and the other surface thereof is adjacent to the connection line 140 to receive the heat. Further, in order to release heat, the bottom heat radiator BHU may be configured by a material having a high heat conductivity. Simultaneously, the bottom heat radiator BHU is in contact with the lower substrate DS which is extendable, so that the bottom heat radiator may be configured by a material having a high extension rate. That is, the bottom heat radiator BHU may be configured by a material having a high heat conductivity and a high extension rate. For example, the bottom heat radiator BHU may be configured by cross-linkage of silver nanowire (Ag-nanowire) or carbon nanotube. Further, the bottom heat radiator BHU is also configured by a non-conductive heat exchange polymer and for example, may be configured by polymer material with a chain structure or polyethylene nanofibers.

Further, the intermediate insulating layer INT1 is disposed between the connection line 140 and the bottom heat radiator BHU. The intermediate insulating layer INT1 electrically insulates the connection line 140 from the bottom heat radiator BHU and transfers heat of the connection line 140 to the bottom heat radiator BHU.

Therefore, the intermediate insulating layer INT1 may be formed of a material having a low electrical conductivity and a high heat conductivity. For example, the intermediate insulating layer INT1 may be configured by a non-conductive heat-exchange polymer and for example, may be configured by a polymer material with a chain structure or polyethylene nanofibers. In some exemplary embodiments, the intermediate insulating layer INT1 may be configured by a triple layered structure of silicon nitride (SiNx) or silicon oxide (SiOx) which is an inorganic material—a silicon carbide (SiC) thin film or a diamond thin film—silicon nitride (SiNx) or silicon oxide (SiOx) which is an inorganic material, but is not limited thereto.

Further, even though in FIG. 4A, only one pillar-shaped bottom heat radiator BHU is illustrated in the heat radiation hole, in some exemplary embodiments, as illustrated in FIG. 4B, the bottom heat radiator BHU may be separated into a plurality of pillar-shaped sub bottom heat radiators SBHU.

Specifically, as illustrated in FIG. 4B, each of the sub bottom heat radiators SBHU may be a pillar which extends in a direction perpendicular to a horizontal direction which is an extending direction of the stretchable display device 100. Further, the sub bottom heat radiator SBHU as described above may be disposed in the horizontal direction which is an extending direction.

As described above, since the bottom heat radiator BHU is separated into a plurality of sub bottom heat radiators SBHU so that a surface area of the bottom heat radiator BHU which is in contact with the outside may be increased. By doing this, a heat radiation efficiency of the bottom heat radiator BHU may be improved so that the heat radiation efficiency of the stretchable display device 100 may be also increased to improve a reliability.

Figure 5A:
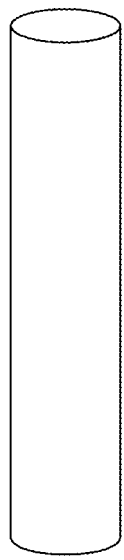
FIGS. 5A to 5C are views illustrating a sub bottom heat radiator and a sub top heat radiator of a stretchable display device according to an exemplary embodiment of the present disclosure.
Figure 5B:
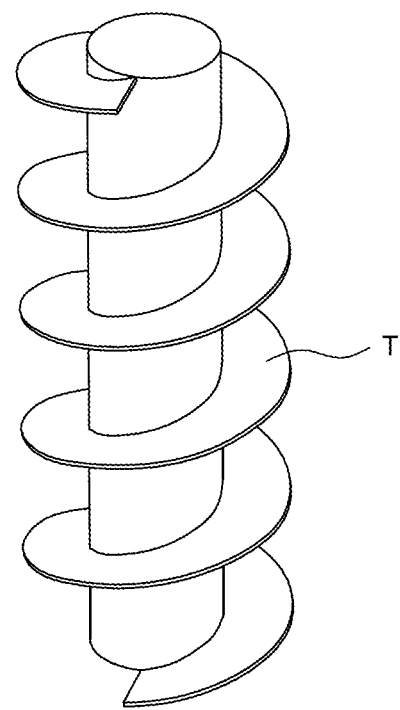
Figure 5C:
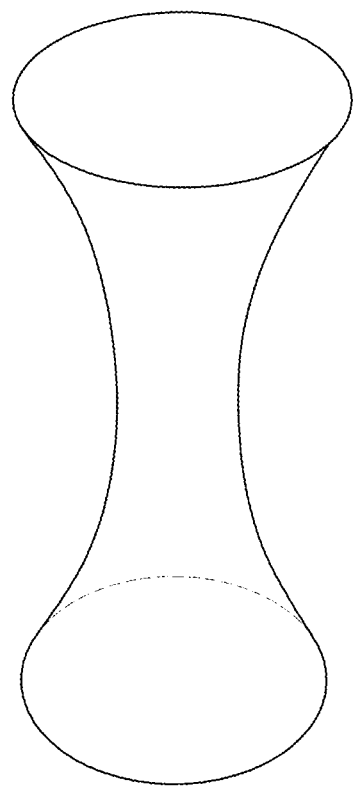

FIGS. 5A to 5C are views illustrating a sub bottom heat radiator and a sub top heat radiator of a stretchable display device according to an exemplary embodiment of the present disclosure.

As illustrated in FIG. 5A, each of the sub bottom heat radiators SBHU of the stretchable display device 100 according to the exemplary embodiment of the present disclosure may have a cylindrical shape extending in a direction perpendicular to the extending direction.

In some exemplary embodiments, in order to increase a surface area of the sub bottom heat radiator SBHU, as illustrated in FIG. 5B, in the sub bottom heat radiator SBHU, a pin spirally disposed along an outer surface of a cylinder may be further comprised in the cylinder extending in a direction perpendicular to the extending direction. In other words, the sub bottom heat radiators SBHU may include threads coupled to an outer surface of the radiator SBHU and extending from the outer surface of the radiator SBHU in a spiral configuration. The number, size, arrangement, and orientation of the threads can be selected according to design factors such as desired amount of heat transfer, among others.

Further, in order to increase the surface area of the sub bottom heat radiator SBHU, as illustrated in FIG. 5C, the sub bottom heat radiator SBHU may be deformed such that an outer circumferential surface of the cylinder extending in a direction perpendicular to the extending direction has a predetermined curvature. As shown in FIG. 5C, the sub bottom heat radiator SBHU may have a concave shape proximate a center of the radiator SBHU with a diameter at the top and bottom of the radiator SBHU that is greater than a diameter at a center of the radiator SBHU. The diameters may change continuously, in some embodiments. In one or more embodiments, the radiator SBHU has a convex shape with a diameter at the center that is greater than the diameter of the radiator SBHU at the top and bottom. Other configurations are possible as well, such as a continuously tapered radiator SBHU with a top diameter greater than or less than a bottom diameter.

As described above, in order to increase the surface area of the sub bottom heat radiator SBHU, the sub bottom heat radiator SBHU may be deformed such that a spiral pin is additionally included on the outer surface or the outer surface has a predetermined curvature. Accordingly, the surface area of the bottom heat radiator BHU of the stretchable display device of the exemplary embodiment of the present disclosure which is in contact with the outside is increased so that the heat radiation efficiency may be increased.

As described above, the heat transferred from the first heat transfer layer 112, the second heat transfer layer 113, and the third heat transfer layer 113 is transferred to the bottom heat radiator BHU through the connection line 140. The bottom heat radiator BHU may discharge heat transferred from the connection line 140 to a lower portion of the stretchable display device 100.

Top Heat Radiator

Figure 6A:
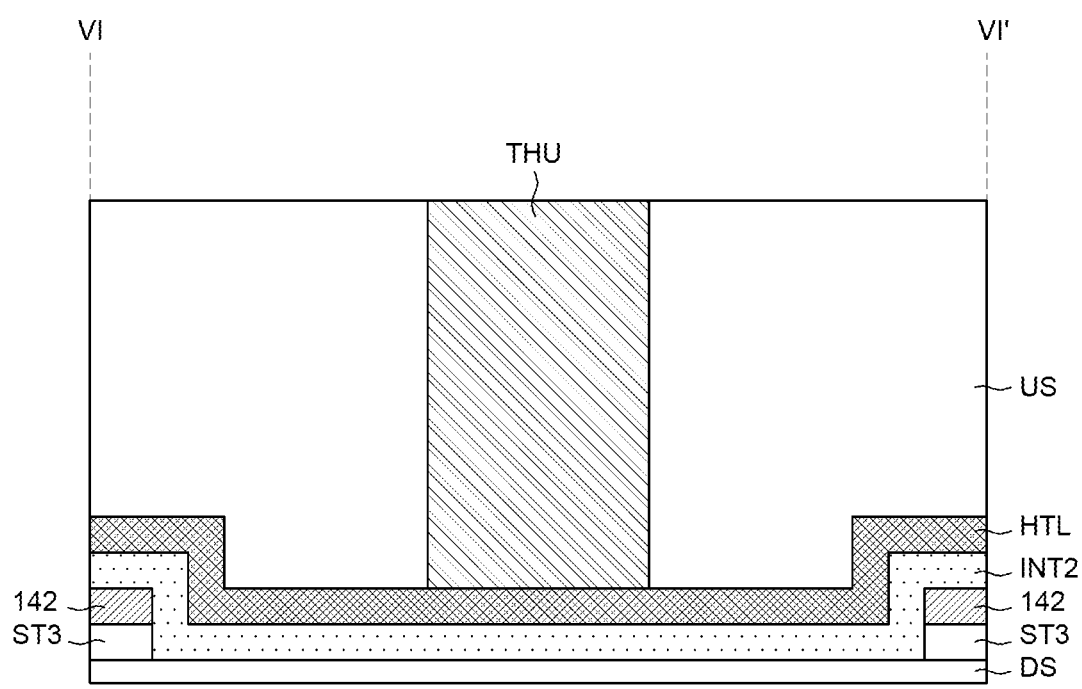
FIGS. 6A and 6B are cross-sectional views taken along the line VI-VI' of FIG. 2A.
Figure 6B:
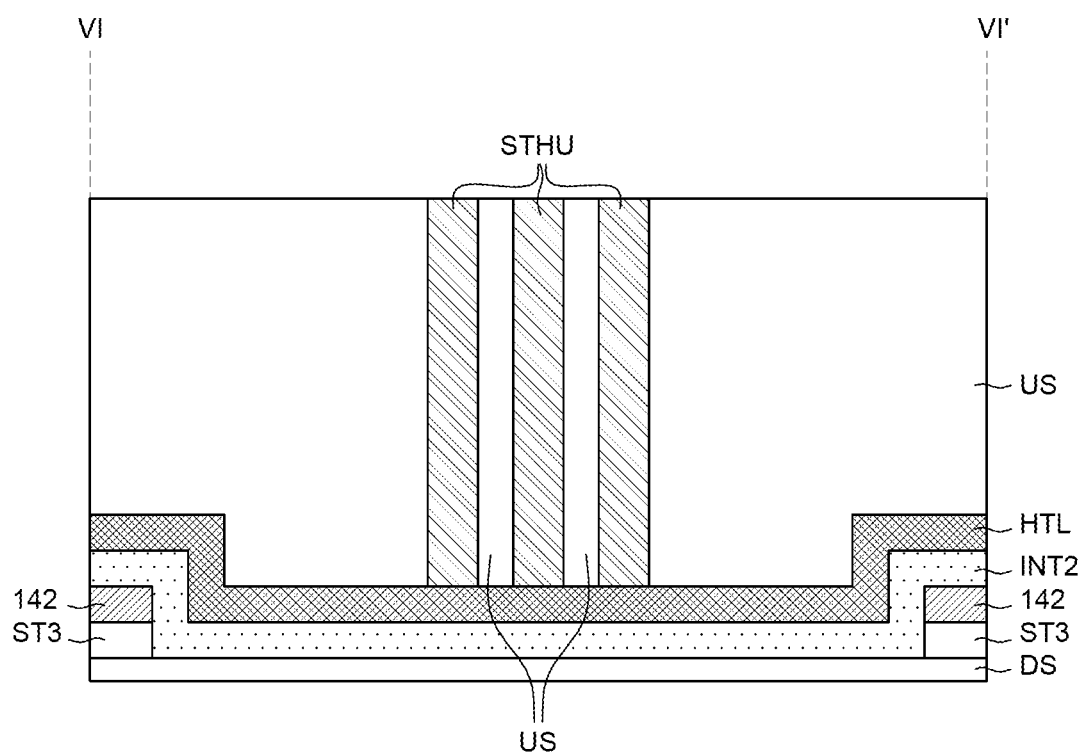

FIGS. 6A and 6B are cross-sectional views taken along the line VI-VI' of FIG. 2A.

As illustrated in FIG. 6A, the stretchable display device 100 according to the exemplary embodiment of the present disclosure may upwardly release heat using a heat transfer line HTL, a line insulating layer INT2, and a top heat radiator THU.

The plurality of heat transfer lines HTL is wiring lines which transfer heat from the plurality of connection lines 140 to the top heat radiator THU.

Therefore, the plurality of heat transfer lines HTL may overlap the plurality of connection lines 140 and the plurality of heat transfer lines HTL may be in contact with the top heat radiator THU.

As described above with reference to FIG. 2A, a plurality of heat transfer lines HTL may be disposed in a soft area between the first substrates ST1 in a matrix. Further, the plurality of heat transfer line HTL may overlap the plurality of connection lines 140 in a partial area.

The plurality of heat transfer lines HTL and the plurality of connection lines 140 need to be electrically separated and need to effectively transfer heat.

Therefore, the line insulating layer INT2 disposed between the plurality of heat transfer lines HTL and the plurality of connection lines 140 may be formed of a material having a low electrical conductivity and a high heat conductivity. For example, the line insulating layer INT2 may be configured by a non-conductive heat-exchange polymer and for example, may be configured by a polymer material with a chain structure or polyethylene nanofibers. In some exemplary embodiments, the line insulating layer INT2 may be configured by a triple layered structure of silicon nitride (SiNx) or silicon oxide (SiOx) which is an inorganic material—a silicon carbide (SiC) thin film or a diamond thin film—silicon nitride (SiNx) or silicon oxide (SiOx) which is an inorganic material, but is not limited thereto.

However, even though in FIG. 6A, it is illustrated that the line insulating layer INT2 is disposed below the heat transfer line HTL, the present disclosure is not limited thereto. Therefore, the line insulating layer INT2 may be disposed with various arrangements which insulate the connection line 140 and the heat transfer line HTL therebetween.

The top heat radiator THU radiates the heat transferred from the heat transfer line HTL to the outside. In order to radiate heat to the outside, one surface of the top heat radiator THU may be exposed to the outside and the other surface thereof is adjacent to the heat transfer line HTL to receive the heat. Further, in order to radiate heat, the top heat radiator THU may be configured by a material having a high heat conductivity. Simultaneously, the top heat radiator THU is in contact with the upper substrate, which is extendable, so that the top heat radiator may be configured by a material having a high extension rate. That is, the top heat radiator THU may be configured by a material having a high heat conductivity and a high extension rate. For example, the top heat radiator THU may be configured by cross-linkage of Ag-nanowire or carbon nanotube. Further, the top heat radiator THU may be also configured by a non-conductive heat exchange polymer and for example, may be configured by polymer material with a chain structure or polyethylene nanofibers.

Further, even though in FIG. 6A, only one pillar-shaped top heat radiator THU is illustrated in the heat radiation hole, in some exemplary embodiments, as illustrated in FIG. 6B, the top heat radiator THU may be separated into a plurality of pillar-shaped sub top heat radiator STHU.

Specifically, as illustrated in FIG. 6B, each of the sub top heat radiators STHU may be a pillar which extends in a direction perpendicular to a horizontal direction which is an extending direction of the stretchable display device 100. Further, the sub top heat radiator STHU as described above may be disposed in a horizontal direction which is an extending direction.

As described above, since the top heat radiator THU is separated into a plurality of sub top heat radiator STHU so that a surface area of the top heat radiator THU which is in contact with the outside may be increased. By doing this, a heat radiation efficiency of the top heat radiator THU may be improved so that the heat radiation efficiency of the stretchable display device is also increased to improve a reliability.

Further, as illustrated in FIG. 5A, each of the sub top heat radiators STHU of the stretchable display device 100 according to the exemplary embodiment of the present disclosure may have a cylindrical shape extending in a direction perpendicular to an extending direction of the stretchable display.

In some exemplary embodiments, in order to increase a surface area of the sub top heat radiator STHU, as illustrated in FIG. 5B, in the sub top heat radiator STHU, a pin spirally disposed along an outer surface of a cylinder may be further comprised in the cylinder extending in a direction perpendicular to the extending direction.

Further, in order to increase a surface area of the sub top heat radiator STHU, as illustrated in FIG. 5C, the sub top heat radiator STHU may be deformed such that an outer circumferential surface of the cylinder extending in a direction perpendicular to the extending direction has a predetermined curvature.

As described above, in order to increase the surface area of the sub top heat radiator STHU, the sub top heat radiator STHU may be deformed such that a spiral pin is additionally included on the outer surface or the outer surface has a predetermined curvature. Accordingly, a surface area of the top heat radiator THU of the stretchable display device of the exemplary embodiment of the present disclosure which is in contact with the outside is increased so that the heat radiation efficiency may be increased.

As described above, the heat transferred from the first heat transfer layer 112, the second heat transfer layer 113, and the third heat transfer layer 113 is transferred to the connection line 140. Further, the heat transferred to the connection line 140 is transferred to the heat transfer line HTL through the line insulating layer INT2. Further, the heat is released to the top heat radiator THU through the heat transfer line HTL so that upward heat radiation of the stretchable display device 100 may be performed.

Organic Light Emitting Element

Figure 7:
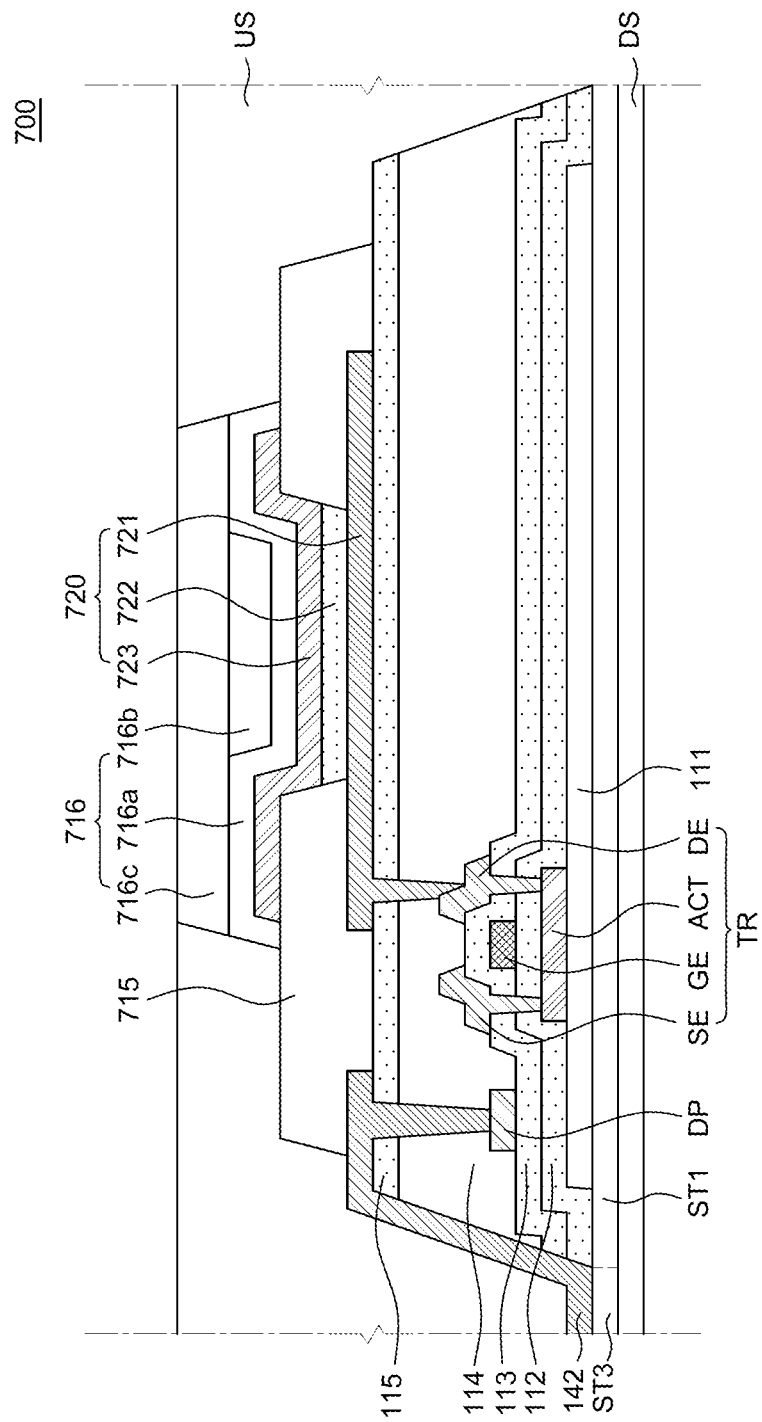
FIG. 7 is a cross-sectional view of a stretchable display device according to another exemplary embodiment of the present disclosure.

FIG. 7 is a cross-sectional view of a stretchable display device according to another exemplary embodiment of the present disclosure. As compared with the stretchable display device 100 illustrated in FIGS. 1 to 6B, in a stretchable display device 700 of FIG. 7, an organic light emitting element 720 is different and a bank 715 and a heat radiation encapsulation layer 716 are further provided. However, the other configuration is substantially the same, so that a redundant description will be omitted.

Referring to FIG. 7, the organic light emitting element 720 is disposed to correspond to each of the plurality of sub pixels SPX and emits light having a specific wavelength band. That is, the organic light emitting element 720 may be a blue organic light emitting element which emits blue light, a red organic light emitting element which emits red light, a green organic light emitting element which emits green light, or a white organic light emitting element which emits white light, but is not limited thereto. When the organic light emitting element 720 is a white organic light emitting element, the stretchable display device 700 may further comprise a color filter.

The organic light emitting element 720 includes an anode 721, an organic light emitting layer 722, and a cathode 723. Specifically, the anode 721 is disposed on the third heat transfer layer 115. The anode 721 is an electrode configured to supply holes to the organic light emitting layer 722. The anode 721 may be configured by a transparent conductive material having a high work function. Here, the transparent conductive material may include indium tin oxide (ITO), indium zinc oxide (IZO), or indium tin zinc oxide (ITZO). Further, when the stretchable display device 700 is implemented as a top emission type, the anode 721 may further comprise a reflector.

The anodes 721 are disposed to be spaced apart from each other for each of the sub pixels SPX to be electrically connected to the transistor TR through a contact hole of the planarization layer 114. For example, in FIG. 7, it is illustrated that the anode 721 is electrically connected to the drain electrode DE of the transistor TR, but the anode 721 may be electrically connected to the source electrode SE.

The bank 715 is disposed on the anode 721 and the third heat transfer layer 115. The bank 715 is a component which divides adjacent sub pixels SPX. The bank 715 is disposed to cover at least a part of both sides of the adjacent anode 721 to expose a part of a top surface of the anode 721. The bank 715 may suppress a problem in that a current is concentrated at the corner of the anode 721 to emit the light to the side surface of the anode 721 so that an unintended sub pixel SPX emits light or colors are mixed. The bank 715 may be formed of acrylic-based resin, benzocyclobutene (BCB)-based resin, or polyimide, but is not limited thereto.

The organic light emitting layer 722 is disposed on the anode 721. The organic light emitting layer 722 is configured to emit light. The organic light emitting layer 722 may include a luminescent material, and the luminescent material may include a phosphorescent material or a fluorescent material, but is not limited thereto.

The organic light emitting layer 722 may be configured by one emission layer. Alternatively, the organic light emitting layer 722 may have a stack structure in which a plurality of emission layers laminated with a charge generation layer therebetween is laminated. Further, the organic light emitting layer 722 may further comprise at least one of a hole transport layer, an electron transport layer, a hole blocking layer, an electron blocking layer, a hole injection layer, an electron injection layer, and the like.

Referring to FIG. 7, the cathode 723 is disposed on the organic light emitting layer 722. The cathode 723 supplies electrons to the organic light emitting layer 722. The cathode 723 may be formed of transparent conductive oxide such as indium tin oxide (ITO), indium zinc oxide (IZO), indium tin zinc oxide (ITZO), zinc oxide (ZnO), and tin oxide (TO) or ytterbium (Yb) alloy. Alternatively, the cathode 723 may be formed of a metal material.

The cathode 723 may be patterned to overlap the plurality of first substrates ST1. That is, the cathode 723 is formed only in an area overlapping the plurality of first substrates ST1 and may not be formed in an area between the plurality of first substrates ST1. Since the cathode 723 is formed of a material such as a transparent conductive oxide or a metal material, when the cathode 723 is formed in the area between the plurality of first substrates ST1, the cathode 723 may be damaged during the process of stretching the stretchable display device 700. Therefore, the cathode 723 may be formed so as to correspond to each of the plurality of first substrates ST1 on a flat surface. Referring to FIG. 7, the cathode 723 may be formed to have an area which does not overlap the area where the connection line 140 is disposed, in an area overlapping the plurality of first substrates ST1.

Unlike the general organic light emitting display device, in the stretchable display device 700 according to still another exemplary embodiment of the present disclosure, the cathode 723 is patterned so as to correspond to the plurality of first substrates ST1. Therefore, the cathode 723 disposed on the plurality of first substrates ST1 may be independently supplied with a low potential power through the connection line 140.

In the meantime, in this specification, it has been described that the LED 120 or the organic light emitting element 720 is used as a light emitting element, but a quantum dot light emitting diode (QLED) may also be used as the light emitting element, and is not limited thereto.

A heat radiation encapsulation layer 716 is disposed on the organic light emitting element 720. The heat radiation encapsulation layer 716 covers the organic light emitting element 720 and is in contact with a part of the top surface of the bank 715 to seal the organic light emitting element 720. Therefore, the heat radiation encapsulation layer 716 protects the organic light emitting element 720 from moisture, air, or physical impact permeating from the outside.

Further, the heat radiation encapsulation layer 716 serves to upwardly discharge heat generated in the organic light emitting element 720. Therefore, an upper portion of the heat radiation encapsulation layer 716 may be exposed to the outside and a lower portion of the heat radiation encapsulation layer 716 may be disposed to be in contact with the organic light emitting element 720.

Specifically, the heat radiation encapsulation layer 716 includes a first heat radiation encapsulation layer 716a, a second heat radiation encapsulation layer 716b, and a third heat radiation encapsulation layer 716c.

The first heat radiation encapsulation layer 716a is in contact with the organic light emitting element 720 and may be configured by silicon nitride (SiNx) or silicon oxide (SiOx) which is an inorganic material.

The second heat radiation encapsulation layer 716b is disposed on the first heat radiation encapsulation layer 716a and may be configured by polymer including a carbon structure having a high heat conductivity, such as a silicon carbide (SiC) structure or a diamond structure.

The third heat radiation encapsulation layer 716c is disposed on the second heat radiation encapsulation layer 716b and may be configured by silicon nitride (SiNx) or silicon oxide (SiOx) which is an inorganic material.

Further, a top surface, a bottom surface, and a side surface of the second heat radiation encapsulation layer 716b are covered by the first heat radiation encapsulation layer 716a and the third heat radiation encapsulation layer 716c. By doing this, the second heat radiation encapsulation layer 716b may be protected from external foreign matters by the first heat radiation encapsulation layer 716a and the third heat radiation encapsulation layer 716c.

Further, since the second heat radiation encapsulation layer 716b is configured by a polymer including a carbon structure, the heat radiation encapsulation layer 716 is not broken due to the external particles. Further, an interface contact property with the first heat radiation encapsulation layer 716a and the third heat radiation encapsulation layer 716c which are configured by an inorganic material may be improved.

As described above, the heat radiation encapsulation layer 716 includes the second heat radiation encapsulation layer 716b having a high heat conductivity to upwardly discharge heat generated in the organic light emitting element 720. Therefore, the heat radiation efficiency of the stretchable display device 700 is increased to improve the reliability.

In the meantime, the heat radiation encapsulation layer 716 covers the cathode 723 which is patterned to overlap the plurality of first substrates ST1 and may be formed in each of the plurality of first substrates ST1. That is, the heat radiation encapsulation layer 716 is disposed so as to cover one cathode 723 disposed in one first substrate ST1 and the heat radiation encapsulation layer 716 disposed on each of the plurality of first substrates ST1 may be spaced apart from each other.

The heat radiation encapsulation layer 716 may be formed only in an area overlapping the plurality of first substrates ST1. As described above, the heat radiation encapsulation layer 716 may be configured to include an inorganic layer so that the heat radiation encapsulation layer may be easily cracked or damaged during a process of stretching the stretchable display device 700. Specifically, since the organic light emitting element 720 is vulnerable to the moisture or oxygen, when the heat radiation encapsulation layer 716 is damaged, the reliability of the organic light emitting element 720 may be reduced. Accordingly, the heat radiation encapsulation layer 716 may be formed only on the plurality of first substrates ST1 which are rigid substrates.

The exemplary embodiments of the present disclosure can also be described as follows:

According to an aspect of the present disclosure, a stretchable display device includes a lower substrate; a plurality of first substrates which is disposed on the lower substrate and includes a plurality of pixels, a plurality of connection lines which electrically connects the plurality of pixels; a plurality of heat transfer lines which overlaps the plurality of connection lines; and a heat radiator which is exposed to the outside and overlaps the plurality of connection lines and the plurality of heat transfer lines.

Each of the plurality of pixels may include a light emitting element which emits light and a transistor which drives the light emitting element The stretchable display device may further comprise a plurality of heat transfer layers which is in contact with the plurality of connection lines.

The plurality of heat transfer layers may include a first heat transfer layer disposed between an active layer and a gate electrode of the transistor.

The plurality of heat transfer layers may include a second heat transfer layer disposed between a gate electrode and a source electrode of the transistor or between the gate electrode and a drain electrode.

The plurality of heat transfer layers may include a third heat transfer layer disposed between the light emitting element and the transistor.

Each of the plurality of heat transfer layers is configured by a non-conductive heat exchange polymer.

The stretchable display device may further comprise a line insulating layer disposed between the plurality of connection lines and the plurality of heat transfer lines.

The plurality of connection lines may include a plurality of first connection lines extending in a first direction and a plurality of second connection lines extending in a second direction.

The plurality of heat transfer lines may include a first heat transfer line which extends in the first direction and is disposed between the plurality of first connection lines and a second heat transfer line which extends in the second direction and is disposed between the plurality of second connection lines.

The stretchable display device may further comprise an intermediate insulating layer disposed between the heat radiator and the plurality of connection lines.

The stretchable display device may further comprise a rigid substrate which overlaps an intersection area of the plurality of connection lines and the plurality of heat transfer lines.

The heat radiator may be configured by a cross-linkage of silver nanowire (Ag-nanowire) or carbon nanotube.

The heat radiator may include a plurality of sub heat radiators extending in a direction perpendicular to an extending direction of the stretchable display.

A pin which is spirally disposed along an outer surface may be disposed on the outer surface of each of the plurality of sub heat radiators.

An outer surface of each of the plurality of sub heat radiators may have a predetermined curvature.

the heat radiator may include a bottom heat radiator disposed in a heat radiation hole of the lower substrate and a top heat radiator disposed in a heat radiation hole of an upper substrate which is opposite to the lower substrate.

The light emitting element is an organic light emitting element.

The stretchable display device may further comprise a heat radiation encapsulation layer disposed on the organic light emitting element.

The heat radiation encapsulation layer may include a first heat radiation encapsulation layer which is configured by an inorganic material and is in contact with the organic light emitting element, a second heat radiation encapsulation layer which is configured by a polymer including a carbon structure and is in contact with the first heat radiation encapsulation layer and a third heat radiation encapsulation layer which is configured by an inorganic material and is in contact with the second heat radiation encapsulation layer.

According to another aspect of the present disclosure, a stretchable display device includes a first flexible substrate; a plurality of rigid substrates which is disposed on the first flexible substrate to be spaced apart from each other; a light emitting element and a transistor disposed on each of the plurality of rigid substrates; a heat transfer layer which transfers heat generated in the light emitting element and the transistor; a plurality of connection lines which is in contact with a side surface of the heat transfer layer; and a bottom heat radiator which passes through the first flexible substrate and radiates heat transferred to the plurality of connection lines.

The stretchable display device may further comprise a second flexible substrate which covers the light emitting element, a plurality of heat transfer lines which overlaps the plurality of connection lines to transfer the heat of the plurality of connection lines and a top heat radiator which passes through the second flexible substrate and is in contact with the plurality of heat transfer lines to radiate heat transferred to the plurality of heat transfer lines.

The stretchable display device may further comprise a heat radiation encapsulation layer which is disposed on the light emitting element and includes a polymer including a carbon structure to radiate heat generated in the light emitting element to the outside.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
a lower substrate;
a plurality of first substrates disposed on the lower substrate and including a plurality of pixels;
a plurality of connection lines electrically connected to the plurality of pixels;
a plurality of heat transfer lines that overlap the plurality of connection lines; and
a heat radiator exposed to an external environment that overlaps the plurality of connection lines and the plurality of heat transfer lines.

2. The stretchable display device according to claim 1, further comprising a plurality of heat transfer layers in contact with the plurality of connection lines, and wherein each of the plurality of pixels includes:
a light emitting element configured to emit light; and
a transistor which drives the light emitting element.

3. The stretchable display device according to claim 2, wherein the plurality of heat transfer layers include a heat transfer layer disposed between an active layer and a gate electrode of the transistor.

4. The stretchable display device according to claim 2, wherein the plurality of heat transfer layers includes a heat transfer layer disposed between a gate electrode and a source electrode of the transistor or between the gate electrode and a drain electrode of the transistor.

5. The stretchable display device according to claim 2, wherein the plurality of heat transfer layers includes a heat transfer layer disposed between the light emitting element and the transistor.

6. The stretchable display device according to claim 2, wherein each of the plurality of heat transfer layers is a non-conductive heat exchange polymer.

7. The stretchable display device according to claim 1, further comprising:
a line insulating layer disposed between the plurality of connection lines and the plurality of heat transfer lines.

8. The stretchable display device according to claim 1, wherein the plurality of connection lines includes:
a plurality of first connection lines extending in a first direction; and
a plurality of second connection lines extending in a second direction that is different to the first direction.

9. The stretchable display device according to claim 8, wherein the plurality of heat transfer lines includes:
a first heat transfer line extending in the first direction and disposed between the plurality of first connection lines; and
a second heat transfer line extending in the second direction and disposed between the plurality of second connection lines.

10. The stretchable display device according to claim 9, wherein the heat radiator overlaps an area where the first heat transfer line and the second heat transfer line intersect.

11. The stretchable display device according to claim 1, further comprising:
an intermediate insulating layer disposed between the heat radiator and the plurality of connection lines.

12. The stretchable display device according to claim 1, further comprising:
a rigid substrate which overlaps an intersection area of the plurality of connection lines and the plurality of heat transfer lines.

13. The stretchable display device according to claim 1, wherein the heat radiator is a cross-linkage of silver nanowire (Ag-nanowire) or carbon nanotube.

14. The stretchable display device according to claim 1, wherein the heat radiator includes a plurality of sub heat radiators extending in a direction perpendicular to the stretchable display.

15. The stretchable display device according to claim 14, wherein each of the plurality of sub heat radiators includes an outer surface with a plurality of threads disposed on the outer surface.

16. The stretchable display device according to claim 14, wherein an outer surface of each of the plurality of sub heat radiators has a concave curvature.

17. The stretchable display device according to claim 1, wherein the heat radiator includes:
a bottom heat radiator disposed in a heat radiation hole of the lower substrate; and
a top heat radiator disposed in a heat radiation hole of an upper substrate which is opposite to the lower substrate.

18. The stretchable display device according to claim 1, wherein the plurality of pixels include an organic light emitting element, and
the stretchable display device further comprises a heat radiation encapsulation layer disposed on the organic light emitting element.

19. The stretchable display device according to claim 18, wherein the heat radiation encapsulation layer includes:
a first heat radiation encapsulation layer which is an inorganic material and is in contact with the organic light emitting element;
a second heat radiation encapsulation layer which is a polymer including a carbon structure and is in contact with the first heat radiation encapsulation layer; and
a third heat radiation encapsulation layer which is an inorganic material and is in contact with the second heat radiation encapsulation layer.

20. A stretchable display device, comprising:
a first flexible substrate;
a plurality of rigid substrates disposed on the first flexible substrate and spaced apart from each other;
a light emitting element disposed on each of the plurality of rigid substrates;
a transistor disposed on each of the plurality of rigid substrates;
a heat transfer layer configured to transfer heat generated by the light emitting element and the transistor;
a plurality of connection lines in contact with a side surface of the heat transfer layer; and
a bottom heat radiator extending through the first flexible substrate and configured to radiate heat transferred to the bottom heat radiator from the plurality of connection lines.

21. The stretchable display device according to claim 20, further comprising:
a second flexible substrate which covers the light emitting element;
a plurality of heat transfer lines which overlap the plurality of connection lines to transfer heat from the plurality of connection lines; and
a top heat radiator extending through the second flexible substrate and in contact with the plurality of heat transfer lines to radiate heat transferred to the top heat radiator from the plurality of heat transfer lines.

22. The stretchable display device according to claim 20, further comprising:
a heat radiation encapsulation layer disposed on the light emitting element and including a polymer including a carbon structure configured to radiate heat generated in the light emitting element to an external environment.

* * * * *